United States Patent [19]

Huffman et al.

[11] Patent Number: 4,719,600
[45] Date of Patent: Jan. 12, 1988

[54] SENSE CIRCUIT FOR MULTILEVEL STORAGE SYSTEM

[75] Inventors: David R. Huffman, Westford; Scott C. Lewis, Essex Junction; James E. Rock, Milton, all of Vt.

[73] Assignee: International Business Machines Corporation, Armonk, N.Y.

[21] Appl. No.: 830,312

[22] Filed: Feb. 18, 1986

[51] Int. Cl.$^4$ .............................................. G11C 7/00
[52] U.S. Cl. ..................................... 365/208; 307/530
[58] Field of Search ............... 365/205, 207, 208, 149, 365/210; 307/530, 355

[56] References Cited

U.S. PATENT DOCUMENTS

| | | | |
|---|---|---|---|
| 4,085,459 | 4/1978 | Hirabayashi | 365/222 |
| 4,181,865 | 1/1980 | Kohyama | 365/208 X |
| 4,300,210 | 11/1981 | Chakravarti | 365/45 |
| 4,327,424 | 11/1981 | Wu | 365/104 |
| 4,377,781 | 3/1983 | Tatsushi et al. | 323/299 |
| 4,388,703 | 6/1983 | Sheppard | 365/104 |
| 4,445,203 | 4/1984 | Iwahashi | 365/189 |
| 4,449,203 | 5/1984 | Adlhoch | 365/104 |
| 4,604,533 | 8/1986 | Miyamoto et al. | 365/208 X |

OTHER PUBLICATIONS

IBM TDB to Beilstein et al, Circuit for Multilevel Logic Implementation, vol. 23, No. 9, 2/81, pp. 4208-4209.

Yamada et al, A New Multilevel Storage Structure for High Density CCD Memory, IEEE Journal of Solid State Circuits, vol. SC-13, No. 5, 10/78, pp. 688-693.

*Primary Examiner*—Joseph A. Popek
*Attorney, Agent, or Firm*—Manny W. Schecter; H. J. Walter; M. H. Klitzman

[57] ABSTRACT

An improved sense circuit for determining the data state of a memory cell in a multilevel storage system is disclosed. The sense circuit includes at least two differential voltage level sensing circuits. A first differential voltage level sensing circuit compares the relative magnitudes of a data input signal voltage level corresponding to a particular memory cell charge level and a first reference voltage level, thereby providing at least one first binary data output signal. The first binary data output signal is then used to generate a second reference voltage level having a magnitude different from that of the first reference voltage level. A second differential voltage sensing level circuit compares the relative magnitudes of an adjusted data input signal voltage level and a second reference voltage level, thereby providing at least one second binary data output signal. The adjusted data input signal corresponds to a function of the first data input signal. Hence, the binary data output signals provided correspond to the charge level stored in the memory cell.

10 Claims, 15 Drawing Figures

FIG. 2.

| MEMORY CELL CHARGE LEVEL | INTERNAL SENSE NODE VOLTAGE LEVELS AT COMPARISON | | | | DATA BITS D1 D2 |
|---|---|---|---|---|---|
| | FIRST DATA INPUT SIGNAL NODE N1 | FIRST REFERENCE NODE N2 | SECOND DATA INPUT SIGNAL NODE N3 | SECOND REFERENCE NODE N4 | |
| 0 | $V_H-V$ | $V_H-3/6V$ | $V_H-V$ | $V_H-5/6V$ | 1  0 |
| 2/6 Q | $V_H-4/6V$ | $V_H-3/6V$ | $V_H-4/6V$ | $V_H-5/6V$ | 1  1 |
| 4/6 Q | $V_H-2/6V$ | $V_H-3/6V$ | $V_H-4/6V$ | $V_H-3/6V$ | 0  0 |
| Q | $V_H$ | $V_H-3/6V$ | $V_H-2/6V$ | $V_H-3/6V$ | 0  1 |

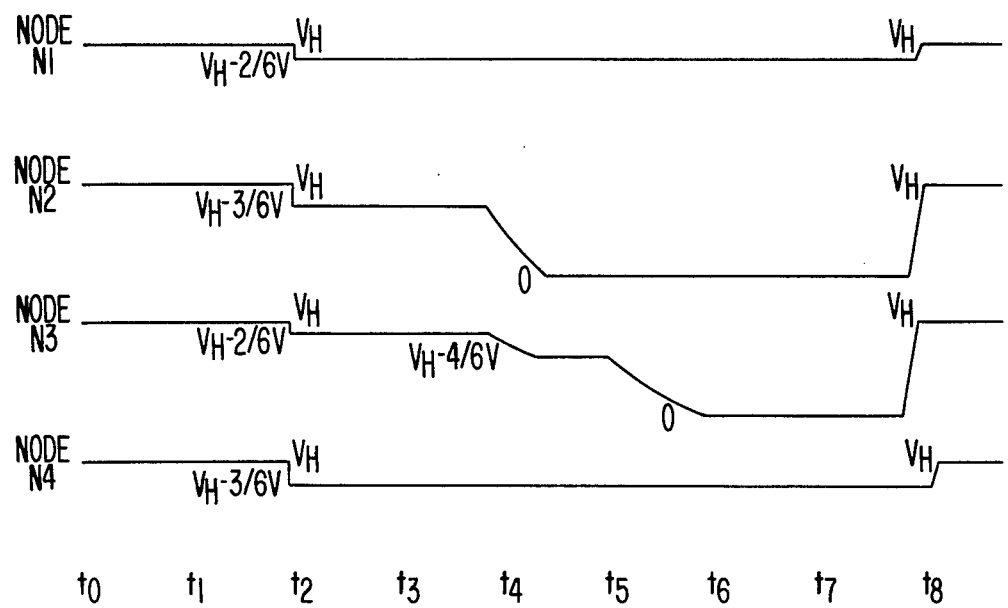
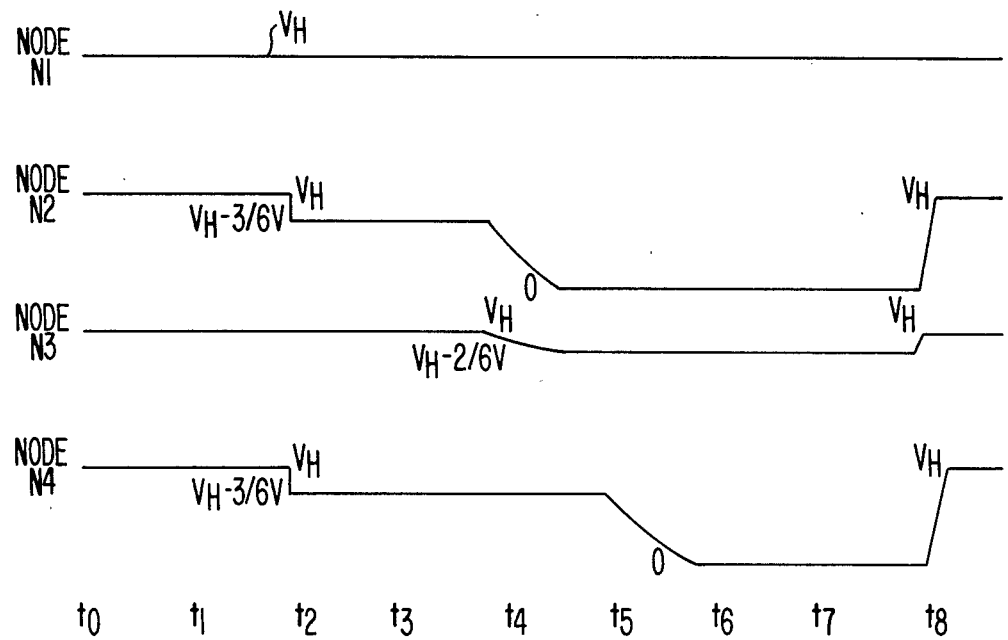

| RE-WRITTEN MEMORY CELL CHARGE LEVEL | VOLTAGE LEVELS FOR RE-WRITE CYCLE (1=HIGH 0=LOW) | | | | DATA BITS | |
|---|---|---|---|---|---|---|
| | NODE N1 | NODE N2 | NODE N3 | NODE N4 | D1 | D2 |
| 0 | 0 | 1 | 0 | 1 | 1 | 0 |
| 2/6 Q | 0 | 1 | 1 | 0 | 1 | 1 |
| 4/6 Q | 1 | 0 | 0 | 1 | 0 | 0 |
| Q | 1 | 0 | 1 | 0 | 0 | 1 |

SENSE CIRCUIT FOR MULTILEVEL STORAGE SYSTEM

DESCRIPTION

BACKGROUND OF THE INVENTION

1. Field of the Invention

This invention relates to a sense circuit for determining the data state of a memory cell in a multilevel storage system, thereby providing binary output signals.

2. Description of the Related Art

Conventional memory cells store one bit of data, 0 or 1, in the form of one of two possible charge levels. For example, a high charge level may represent the data bit 1, whereas a low charge level may represent the data bit 0. In order to read the stored data, a data input signal is compared to a reference voltage level. The data input signal is at one of two voltage levels determined by which of the two possible charge levels is present in the memory cell. The reference voltage level is set between the two possible voltage levels corresponding to the two possible charge levels of the memory cell. By determining whether the voltage level of the data input signal is higher or lower than the reference voltage level, the data state of the memory cell may be read.

Multilevel storage systems for storing data in the form of more than two possible charge levels have recently become of interest. Such systems increase the amount of data stored per cell, thus potentially increasing the overall storage density of memory systems. A sample multilevel storage system stores several bits of data per memory cell. For example, the four unique states capable of being represented by two data bits (00), (01), (10), and (11) can correspond to the charge levels 0, 2, 4, and 6 charge units respectively. Unfortunately, the sense scheme necessary to read the data stored in a memory cell becomes more complex as more data is stored in the cell. A single reference voltage level can no longer be used since four possible data input signal voltage levels are required for correspondence with the four possible stored charge levels.

Existing sense schemes for multilevel storage systems employ a plurality of fixed reference voltage levels for comparison with the data input signal voltage level corresponding to the memory cell charge level. Referring to the four possible charge level system described above, a typical sense scheme employing a plurality of fixed reference voltage levels might work as follows. Data input signal voltage levels of 0, 2, 4, and 6 voltage units correspond to memory cell charge levels of 0, 2, 4, and 6 charge units respectively. The relative magnitudes of the data input signal voltage level and each of three fixed reference voltage levels are compared. Three appropriate fixed reference voltage levels would be 1, 3, and 5 voltage units. By determining whether the data input signal voltage level is higher or lower than each of the three fixed reference voltage levels, the memory cell charge level may be determined. Since each memory cell charge level corresponds to one of the four states represented by two data bits, the stored data may be read. As the amount of data stored per cell increases, the number of reference voltage levels required to read the data state of a memory cell also increases. Thus, in deciding whether or not to use a multilevel storage system, one must weigh the factor of increased storage cell density against the increased complexity of the sense scheme for reading the data state of a memory cell.

Factors to be considered in evaluating a multilevel storage system include circuit space, performance, and required signal characteristics. The increased complexity of the sense scheme in a multilevel storage system may require mor circuit devices and hence a greater increase in circuit space than is saved by the increase in overall storage density. This is a particularly important consideration in the production of miniature, high density integrated circuit chips where chip space is at a premium. In addition, the increased complexity of the sense scheme in a multilevel storage system may reduce the speed with which a memory cell may be read or written. Finally, the required signal characteristics of a multilevel storage system must also be considered. As the number of possible data input signal voltage levels is increased, the magnitude of voltage separating such voltage levels decreases. The ability to differentiate between voltage levels then becomes more difficult since less signal noise is required to cause a misinterpretation of a voltage level. For one device cell dynamic memories, a high ratio of memory cell capacitance to signal line capacitance is thus desired because such will allow for a broad range of possible stored charge levels at which signal noise will not interfere with system operation.

It is therefore desirable to create an improved sense circuit for a multilevel storage system in which the previously described factors weigh more favorably in considering the use of such a multilevel storage system.

SUMMARY OF THE INVENTION

It is the principal object of this invention to provide an improved sense circuit for determining the data state of a memory cell in a multilevel storage system.

Another object of this invention is to provide a sense circuit for determining the data state of a memory cell in a multilevel storage system whereby the circuit space required to produce the sense circuit is reduced.

Yet another object of this invention is to provide a sense circuit for determining the data state of a memory cell in a multilevel storage system whereby the speed of the sense circuit is increased.

These and other objects of this invention are accomplished by employing at least two differential voltage level sensing circuits. A first differential voltage level sensing circuit compares the relative magnitudes of a data input signal voltage level and a first reference voltage level, thereby providing at least one first binary data output signal. The first binary data output signal voltage level corresponds to the charge level of the memory cell being read. The first binary data output signal is then used to generate a second reference voltage level having a magnitude different from that of the first reference voltage level. A second differential voltage level sensing circuit compares the relative magnitudes of an adjusted data input signal voltage level and the second reference voltage level, thereby providing at least one second binary data output signal. The adjusted data input signal corresponds to a function of the first data input signal. Hence, the binary data output signals correspond to the charge level stored in the memory cell.

BRIEF DESCRIPTION OF THE DRAWING

FIG. 2 is a chart representing the correspondence of parameters for the sense circuit shown in FIG. 1 when reading data stored in memory cell 11.

FIG. 6 is a chart showing the internal sense node signal waveforms throughout one read cycle for the sense circuit shown in FIG. 1, used with the re-write circuit shown in FIG. 8, when reading charge level 4/6Q stored in memory cell 11.

FIG. 7 is a chart showing the internal sense node signal waveforms throughout one read cycle for the sense circuit shown in FIG. 1, used with the re-write circuit shown in FIG. 8, when reading charge level Q stored in memory cell 11.

DESCRIPTION OF THE PREFERRED EMBODIMENT

Figure 1:
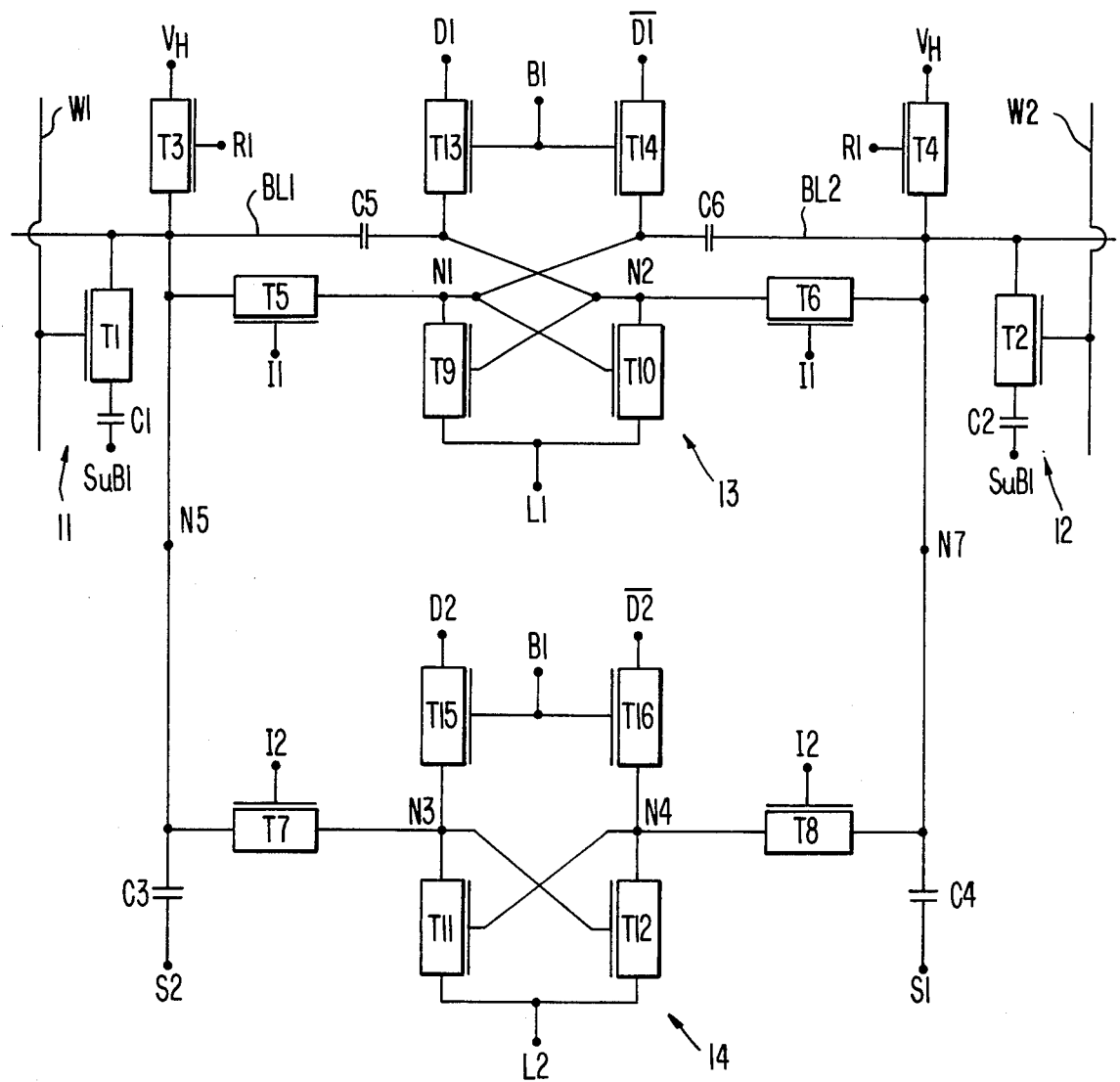
FIG. 1 is a schematic representation of a sense circuit for a multilevel storage system according to the invention.
Figure 4:
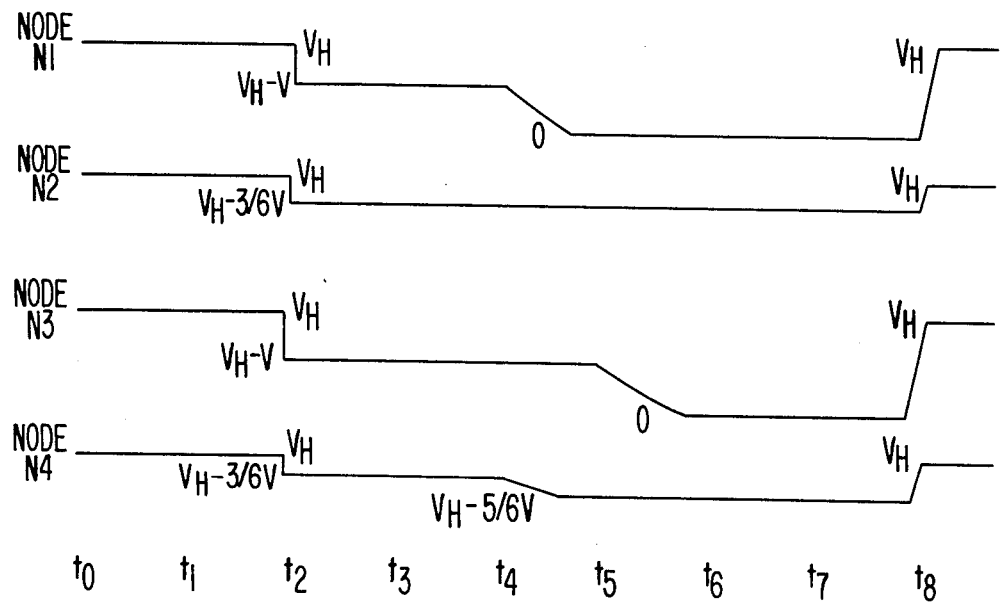
FIG. 4 is a chart showing the internal sense node signal waveforms throughout one read cycle for the sense circuit shown in FIG. 1, used with the re-write circuit shown in FIG. 8, when reading charge level 0 stored in memory cell 11.

A sense circuit for a multilevel storage system is schematically simulated in FIG. 1. The memory cell charge level may be any of four possible charge levels, 0, 2/6Q, 4/6Q, or Q corresponding to data input signal voltage levels of $V_H$-V, $V_H$-4/6V, $V_H$-2/6V, or $V_H$, respectively. The charge levels correspond to two bits of data as shown in FIG. 2. The precise correspondence between the charge levels and the voltage levels is irrelevant so long as some form of correspondence exists. The data input signal voltage level is compared to a first reference voltage level, set at $V_H$-3/6V. If the data input signal voltage level is less than $V_H$-3/6V, such data input signal voltage level must be either $V_H$-V or $V_H$-4/6V. Thus, D1 as shown in FIG. 2 must be a 1 and a second reference voltage level is set at $V_H$-5/6V. If, however, the data input signal voltage level is greater than $V_H$-3/6V, then such data input signal voltage level must be either $V_H$-2/6V or $V_H$. D1 must then be a $0_1$, the data input signal is adjusted lower by 2/6V, and the second refrence voltage level is set at $V_H$-3/6V. Upon subsequent comparison of the second or adjusted data input signal voltage level to the second reference voltage level, the precise data input signal voltage level may be determined. Hence, D2 may also be derived. Using the results of the first comparison of voltage levels to set the second reference voltage level saves circuit space, and improves circuit speed.

In FIG. 1, data is stored in memory cells 11 or 12 as one of four possible charge levels. Memory cells 11 and 12 are shown as one device cells comprising a capacitor C1 or C2 and a transistor T1 or T2. Capacitors C1 and C2 are connected to silicon substrate contact SUB1 for the case of a data detection circuit on a silicon integrated circuit chip. However, any means of connecting capacitors C1 and C2 to a DC voltage level signal may be used. Additionally, any memory cell configuration may be employed to store data.

Initially, the charge level is written into memory cells 11 or 12 through transistors T1 or T2. The data is written by pulsing both bit decode signal B1 and the appropriate word line signal W1 or W2 to a high voltage level. This sets the internal nodes N1 or N2 or N3 or N4 to their required voltage states. Writing then proceeds as in the re-write following a read cycle.

The sense circuit includes two cross-coupled sense amplifier circuits, first differential voltage level sensing circuit 13 and second differential voltage level sensing circuit 14. It is important to note that the input timing signals used to operate the sense circuit will be different depending upon the re-write circuit used to maintain data in the memory cells. Referring to FIGS. 1-4, operation of the sense circuit in a manner compatible with the re-write circuit shown in FIG. 8 will now be disclosed for the case when reading the data bits (D1=1, D2=0)) stored as 0 charge units in memory cell 11. The operation of the re-write circuit shown in FIG. 8 will be described later.

Initially, at time t0, restore signal R1 is at a bootstrapped arbitrary level of voltage $V_H+$. This ensures that transistors T3 and T4 are on and have charged bit lines BL1 and BL2 to voltage level $V_H$. Isolation signals I1 and I2 are also at voltage level $V_H+$, ensuring that transistors T5-T8 are all on. Internal sense nodes N1-N4 are thus initially at voltage level $V_H$. Latch signals L1 and L2 are also at voltage level $V_H$. Select signals S1 and S2 are at voltage level ($V_H$-$V_T$) where $V_T$ is the threshold voltage of memory cell transistors T1 and T2. Word line signals W1 and W2 are at zero voltage to ensure that transistors T1 and T2 are off and that the charge levels of capacitors C1 and C2 are maintained. At time t1, restore signal R1 is pulsed to ground to switch off transistors T3 and T4.

At time t2, a memory cell is selected to be read by pulsing the appropriate word line signal W1 or W2 to $V_H$. For reading the data stored in memory cell 11, word line signal W1 is used. Transistor T1 is thus switched on, allowing capacitor C1 to charge from 0 to a level Q, the charge coming from the parasitic capacitance of bit line BL1. The relationship between charge (q), capacitance (C), and voltage (V) is shown by the well known equation $$q = CV \qquad (1)$$

for both capacitor C1 and bit line BL1 before transistor T1 is switched on. After transistor T1 is switched on, the total charge must be equal to the final voltage Vf of either capacitor C1 or bit line BL1 (since capacitor C1 and bit line BL1 are shorted, their voltage level will be the same) multiplied by the sum of the capacitances of capacitor C1 and bit line BL1. The final equilibrium condition can be represented by the equation $$V_f = \frac{C_{BL} V_{BLi} + C_C V_{Ci}}{C_{BL} + C_C} = \frac{C_{BL} V_{BLi}}{C_{BL} + C_C} \qquad (2)$$

since $V_{ci} = 0$ where the subscripts "$c_i$" and "$BL_i$", refer to the initial voltage of capacitor C1 and the initial voltage of bit line BL1. Thus, as the initial charge level of capacitor C1 is increased from 0 to Q, the final voltage level of bit line BL1 resulting form the charging of capacitor C1 will decrease linearly. As the bit line voltage drops, transistor T5 turns on at time t2. The voltage level at node N1 falls from $V_H$ to ($V_H$-V) where V is the linear voltage drop occurring from the charging of capacitor C1 from charge level 0 to charge level Q.

Also at time t2, the appropriate select signal S1 or S2 is pulsed to ground to set nodes N1 or N2 through capacitors C3 or C4 for the voltage comparison to determine D1. Capacitors C3 and C4 are designed to outcouple approximate voltage 3/6V from nodes N1 and N2, respectively. For reading the data stored in memory cell 11, select signal S1 is used to set node N2 at a first reference voltage level ($V_H$-3/6V) through capacitor C4.

At time t3, isolation signal I1 is pulsed to ground to switch off transistors T5 and T6, thereby isolating nodes N1 and N2 from second differential voltage level sensing circuit 14 except through capacitors C5 and C6. At time t4, latch signal L1 is pulsed to ground to compare the voltage levels at internal sense nodes N1 and N2. Transistors T9 and T10 operate as a conventional latch, slowly discharging the node at the lower voltage level. Since node N1 was at data input signal voltage level ($V_H$-V) and node N2 was at first reference voltage level ($V_H$-3/6V), node N1 is discharged. Capacitors C5 and C6 are designed to outcouple approximate voltage 2/6V from nodes N3 and N4 respectively depending on which of nodes N1 and N2 has been discharged. Since node N1 was discharged, capacitor C6 causes the second reference voltage level at node N4 to drop to ($V_H$-5/6V). Node N3 remains at data input signal voltage level ($V_H$-V).

At time t5, latch signal L2 is pulsed to ground to compare the voltage levels at internal sense nodes N3 and N4. Similar to the first voltage comparison, transistors T11 and T12 operate as a conventional latch, slowly discharging the node at the lower voltage level. Since node N3 was at data input signal voltage level ($V_H$-V) and node N4 was at second reference voltage level ($V_H$-5/6V), node N3 is discharged along with BL1. At time t6, isolation signal I2 is pulsed to ground to switch off transistors T7 and T8, thereby isolating nodes N3 and N4 from the remaining circuit. Bit decode signal B1 controls the output of data and may be activated at any time after a voltage comparison at the respective latch has been completed. Pulsing the bit decode signal B1 to high voltage level switches on transistors T13–T16. The data bits are then outputted as high or low voltage first binary data output signals through data outputs D1 and D1, and high or low voltage second binary data output signals through data outputs D2 and D2. In the sense circuit of FIG. 1, a high level voltage binary output data signal represents the data bit 1 and a low level voltage binary data output signal represents the data bit 0, though such precise correlation is unnecessary. Thus, the high level voltage first binary data output signal at data output D1 and the low level voltage second binary data output signal at data output D2 represent the data bits (10).

At time t7, after data has been re-written, word line signal W1 is pulsed to ground to switch off transistor T1 and isolate capacitor C1. At time t8, restore signal R1, select signal S1, isolation signals I1 and I2, and latch signals L1 and L2 are pulsed back to their respective levels that existed at time t0. The sense circuit is thus reset in preparation for another data reading cycle.

Figure 5:
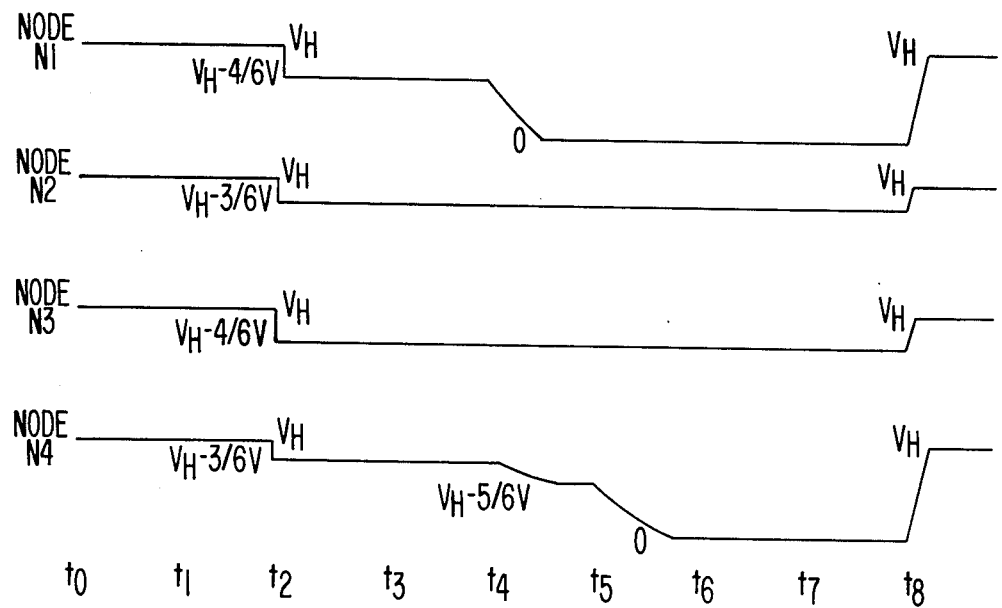
FIG. 5 is a chart showing the internal sense node signal waveforms throughout one read cycle for the sense circuit shown in FIG. 1, used with the re-write circuit shown in FIG. 8, when reading charge level 2/6Q stored in memory cell 11.
Figures 8, 9:
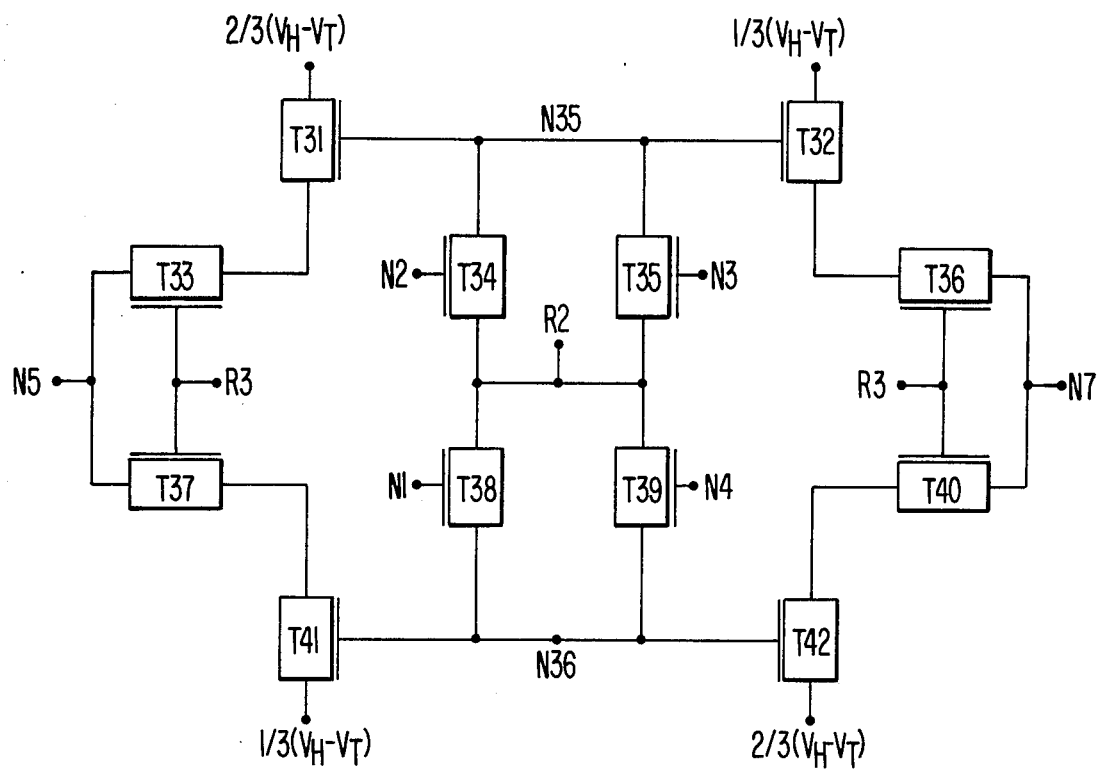
FIG. 8 is a schematic representation of a re-write circuit for use in the sense circuit of FIG. 1 for a multi-level storage system according to the invention.
FIG. 9 is a chart representing the correspondence of parameters for the re-write circuits shown in FIGS. 8 and 15 when re-writing data into memory cell 11 of FIG. 1.

FIG. 5 refers to the case when reading the data bits (D1=1, D2=1), stored in memory cell 11 as charge level 2/6Q, in a manner compatible with the re-write circuit shown in FIG. 8. The data detection circuit operates as previously described except that switching on transistor T1 reduces the voltage levels at nodes N1 and N3 to ($V_H$-4/6V) because capacitor C1 is already partially charged to 2/6Q at time t2. At time t4, node N1 is slowly discharged since data input signal voltage level ($V_H$-4/6V) at node N1 is lower than first reference voltage level ($V_H$-3/6V) at node N2. Capacitor C6 then reduces the voltage level at node N4 to ($V_H$-5/6V). At time t5, data input signal voltage level ($V_H$-4/6V) at node N3 is compared to second reference voltage level ($V_H$-5/6V) at node N4. Thus, node N4 is slowly discharged at time t5, thereby accounting for the difference in reading the data bits (11) from the prior example of reading the data bits (10).

FIG. 6 refers to the case when reading the data bits (D1=0, D2=0), stored in memory cell 11 as charge level 4/6Q, in a manner compatible with the re-write circuit shown in FIG. 8. The sense circuit operates as previously described except that switching on transistor T1 reduces the voltage levels at nodes N1 and N3 to ($V_H$-2/6V) because capacitor C1 is already partially charged to 4/6Q at time t2. At time t4, node N2 is slowly discharged since data input voltage level ($V_H$-2/6V) at node N1 is higher than first reference voltage level ($V_H$-3/6V) of node N2. Capacitor C5 then reduces the voltage level at node N3 to ($V_H$-4/6V). At time t5, node N3 is thus at adjusted data input signal voltage level ($V_H$-4/6V) and node N4 is at second reference voltage level of ($V_H$-3/6V). Hence, node N3 is slowly discharged, thereby accounting for the data bits (00).

FIG. 7 refers to the case when reading the data bits (D1=0, D2=1), stored in memory cell 11 as charge level Q, in a manner compatible with the re-write circuit shown in FIG. 8. The sense circuit operates as previously described except that switching on transistor T1 does not reduce the voltage levels at nodes N1 and N3 because capacitor C1 is already fully charged to Q at time t2. At time t4, node N2 is slowly discharged since data input signal voltage level $V_H$ at node N1 is higher than first reference voltage level ($V_H$-3/6V) at node N2. Capacitor C5 then reduces the voltage level at node N3 to ($V_H$-2/6V). At time t5, node N3 is thus at adjusted data input signal voltage level ($V_H$-2/6V) and node N4 is at second reference voltage level ($V_H$-3/6V). Hence, node N4 is slowly discharged, thereby accounting for the data bits (01).

Figure 3:
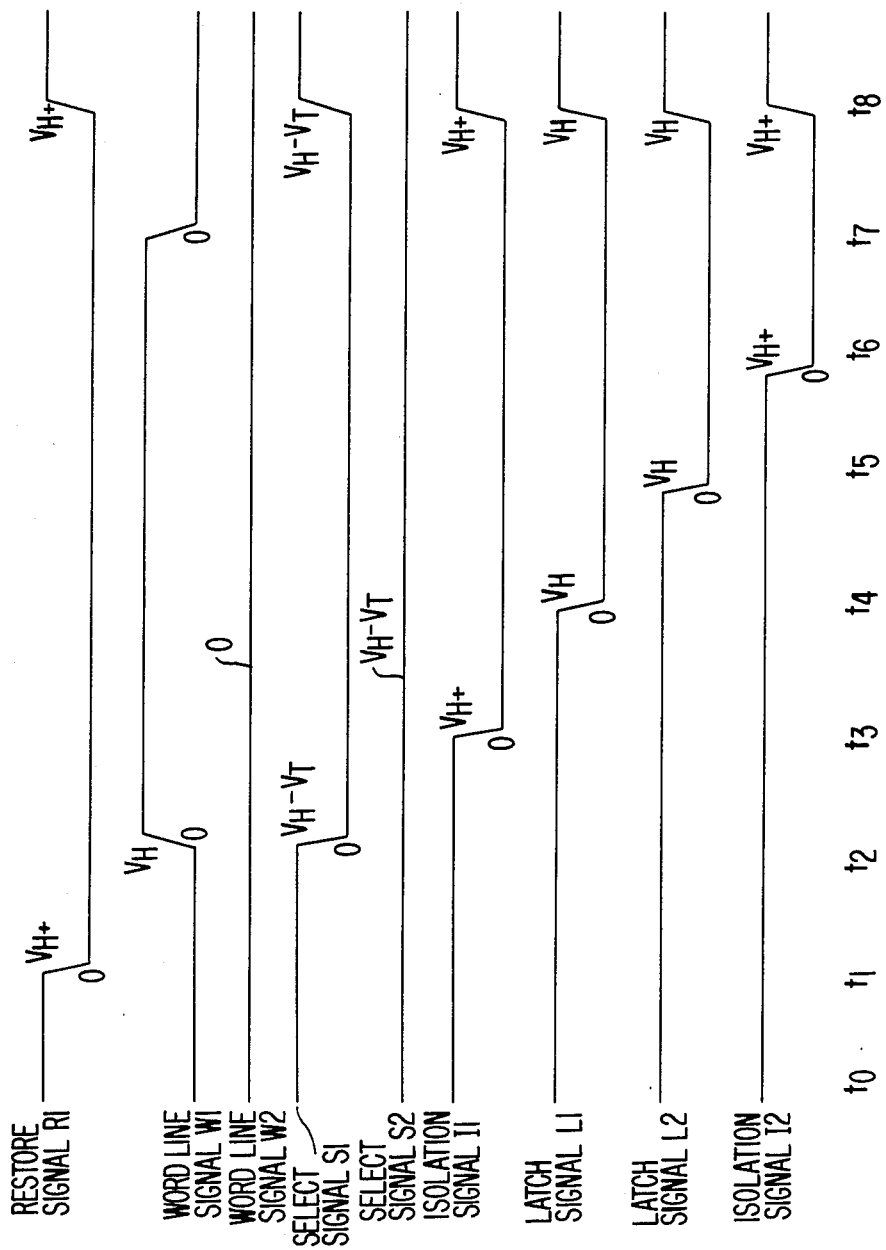
FIG. 3 is a chart showing the input timing signals throughout one read cycle for the sense circuit shown in FIG. 1, used with the re-write circuit shown in FIG. 8, when reading data stored in memory cell 11.

After the data is read, it is necessary to re-write the same charge level back into the memory cell to avoid the loss of the stored data. Referring to FIG. 3, this is accomplished between times t6 and t7, while the appropriate word line signal remains high. A re-write circuit for performing the re-write function in conjunction with the sense circuit of FIG. 1, operated with the timing signals of FIG. 3 as previously described, is shown in FIG. 8. The re-write circuit includes twelve transistors, T31–T42, connected to the sense circuit between nodes N5 and N7.

Operation of the re-write circuit of FIG. 8 will now be disclosed referring to FIG. 9 for the case when re-writing the data bits (10) as charge level 0 back into memory cell 11. Initially, restore signal R3 is grounded to keep transistors T33, T36, T37, and T40 off and prevent any signals from reaching nodes N5 and N7. Restore signal R2 is at voltage level $V_H$ Nodes N1–N4, also shown in FIG. 1, are initially at the voltage levels shown in FIG. 4 at time t6. These voltages correspond to those shown in FIG. 9, where a "0" represents a discharged or low node and a "1" represents an undischarged or high node. Nodes N1 and N3 are initially at a low voltage level while nodes N2 and N4 are at a high voltage level. Thus, transistors T34 and T39 are on while transistors T35 and T38 are switched off. Restore signal R2 is then pulsed to ground. Since transistors T34 and T39 are on, nodes N35 and N36 are discharged, thereby switching off transistors T31, T32, T41, and T42. Restore signal R3 is then pulsed to $V_H$, thereby switching on transistors T33, T36, T37, and T40. However, because transistors T31, T32, T41, and T42 are off, nodes N5 and N7 are uneffected. Because isolation signal I2 and word line signal W1 were high, pulsing down latch signal L2 at time t5 had discharged capacitor C1 as well as node N3 during reading of the data bits (10). Thus, capacitor C1 will remain appropriately discharged to represent the data bits (10) when restore signal R3 is pulsed to $V_H$. Note that because word line signal W2 is at ground, the signal through node N7 cannot effect capacitor C2.

When re-writing the data bits (11) as charge level 2/6Q back into memory cell 11, nodes N1 and N4 are initially at a low voltage level while nodes N2 and N3 are at a high voltage level. Thus, transistors T34 and T35 are on and transistors T38 and T39 are off when restore signal R2 is pulsed to ground. Node N35 is thereby discharged switching off transistors T31 and T32. Node N36 remains high, maintaining transistors T41 and T42 as on. When restore signal R3 is pulsed to $V_H$, node N5 goes to voltage level ⅔ ($V_H$-$V_T$), causing capacitor C1 to appropriately charge to 6Q. Note again that because word line signal W2 is at ground, the signal voltage level of ⅔ ($V_H$-$V_T$) at node N8 cannot effect capacitor C2.

When re-writing the data bits (00) as charge level 4/6Q back into memory cell 11, nodes N2 and N3 are initially at a low voltage level while nodes N1 and N4 are at a high voltage level. Thus, transistors T38 and T39 are on and transistors T34 and T35 are off when restore signal R2 is pulsed to ground. Node N36 is thereby discharged switching off transistors T41 and T42. Node N35 remains high, maintaining transistors T31 and T32 as on. When restore signal R3 is pulsed to $V_H$, node N5 goes to voltage level ⅓ ($V_H$-$V_T$), causing capacitor C1 to appropriately charge to 4/6Q. Note again that because word line signal W2 is at ground, the signal voltage level of ⅓ ($V_H$-$V_T$) at node N7 cannot effect capacitor C2.

When re-writing the data bits (01) as charge level Q back into memory cell 11, nodes N2 and N4 are initially at a low voltage level while nodes N1 and N3 are at a high voltage level. Thus, transistors T35 and T38 are on and transistors T34 and T39 are off when restore signal R2 is pulsed to ground. Nodes N35 and N36 are thereby discharged switching off transistors T31, T32, T41, and T42. When restore signal R3 is pulsed to $V_H$, nodes N5 and N7 are uneffected. Capacitor C1 was left slightly less than fully charged after reading the data bits (01) because of the discharging of node N2 at time t4. However, this is only a form of noise which is compensated for by using slightly larger capacitors C3 and C4 to compress the actual charged levels of the memory cells. Thus, the re-write cycle will appropriately charge capacitor C1 to its fullest extent. Note again that because word line signal W2 is at ground, the signal voltage level at node N7 cannot effect capacitor C2.

Figure 10:
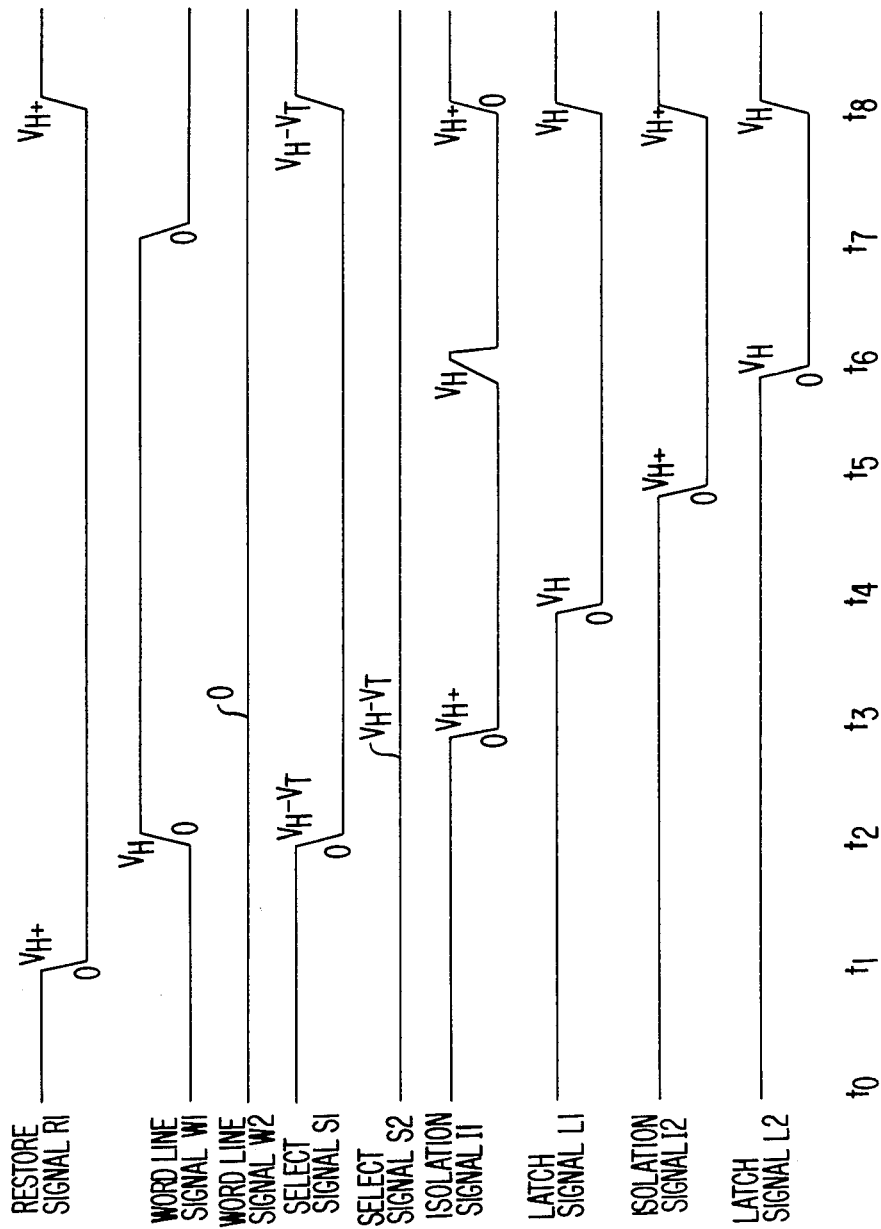
FIG. 10 is a chart showing the input timing signals throughout one read cycle for the sense circuit shown in FIG. 1, used with the re-write circuit shown in FIG. 15, when reading data stored in memory cell 11.
Figure 11:
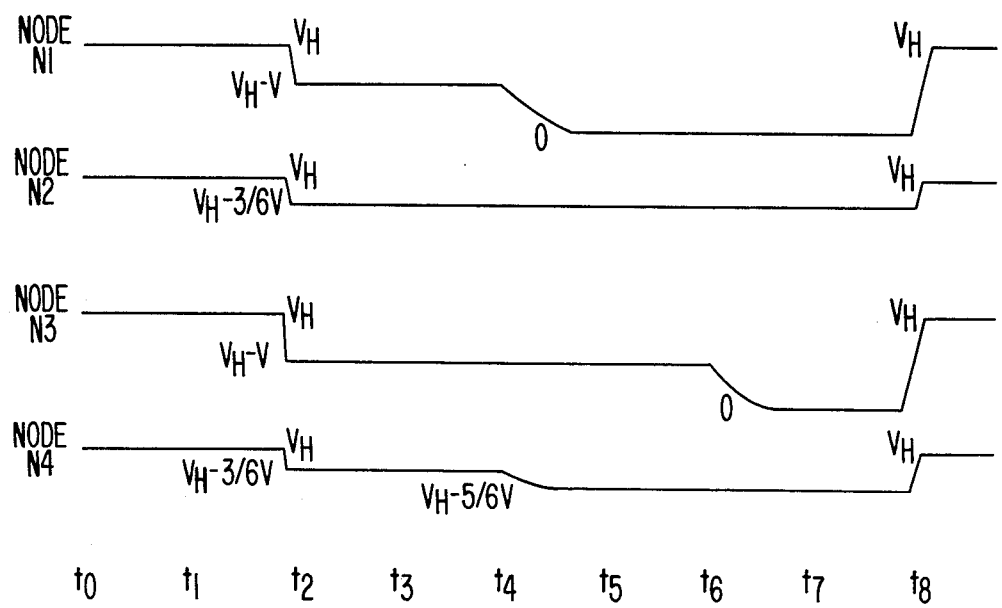
FIG. 11 is a chart showing the internal sense node signal waveforms throughout one read cycle for the sense circuit shown in FIG. 1, used with the re-write circuit shown in FIG. 15, when reading charge level 0 stored in memory cell 11.
Figure 12:
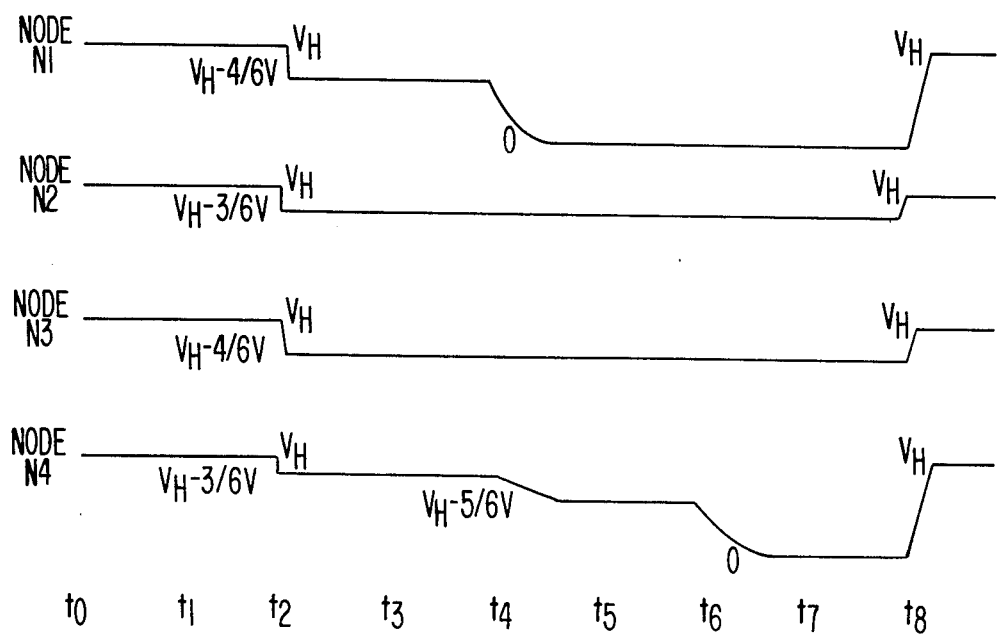
FIG. 12 is a chart showing the internal sense node signal waveforms throughout one read cycle for the sense circuit shown in FIG. 1, used with the re-write circuit shown in FIG. 15, when reading charge level 2/6Q stored in memory cell 11.
Figure 13:
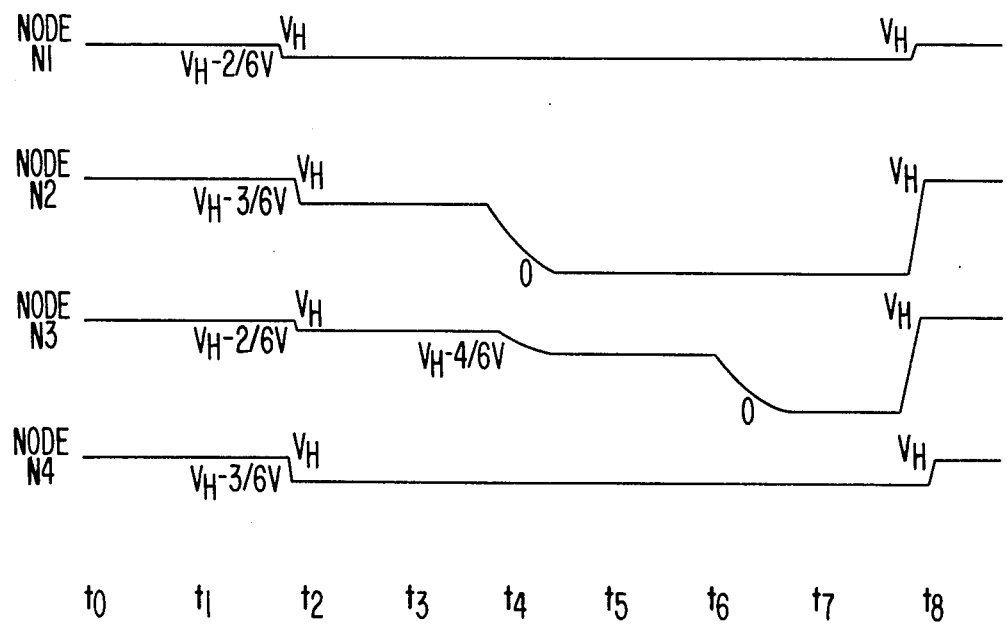
FIG. 13 a chart showing the internal sense node signal waveforms throughout one read cycle for the sense circuit shown in FIG. 1, used with the re-write circuit shown in FIG. 15, when reading charge level 4/6Q stored in memory cell 11.
Figure 14:
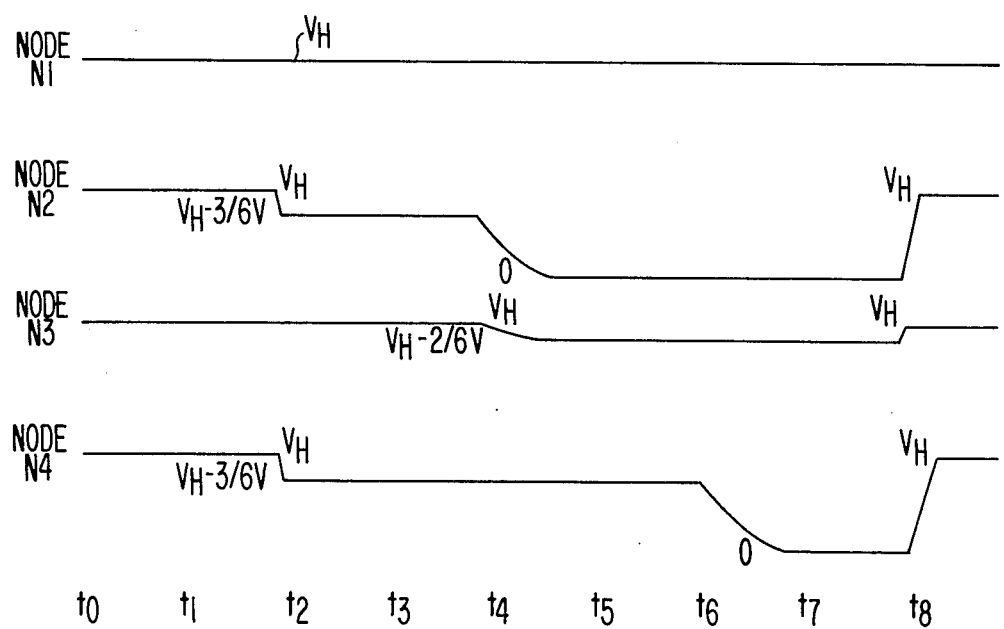
FIG. 14 is a chart showing the internal sense node signal waveforms throughout one read cycle for the sense circuit shown in FIG. 1, used with the re-write circuit shown in FIG. 15, when reading charge level Q stored in memory cell 11.

The sense circuit of FIG. 1 may also be operated with other re-write circuits. However, the input timing signals required may be different for other re-write circuits. For example, the input timing signals of FIG. 10 are used to operate the sense circuit of FIG. 1 in a manner compatible with the re-write circuit shown in FIG. 15. FIGS. 11-14 show the internal sense node signal waveforms for a read cycle using the input timing signals of FIG. 10. The difference between the input timing signals of FIG. 3 and FIG. 10 includes a reversal in the order of grounding latch signal L2 and isolation signal I2 at times t5 and t6. FIG. 10 also includes a short pulse of isolation signal I1 to $V_H$ at time t6. This allows the state of nodes N1 and N2 to condition nodes N5 and N7 and hence also capacitor C1 or C2 at the beginning of a re-write cycle at time t6. Hence, the actual length of time that isolation signal I1 will be pulsed to $V_H$ will be the maximum time required to condition capacitor C1 or C2. The re-write cycle will then begin after isolation signal I1 is grounded again. Thus, the actual time elapsed between t6 and t7 must be long enough to accommodate both the conditioning of the capacitors and a complete re-write cycle. Note that for the input timing signals of FIG. 3, the capacitors were conditioned for the re-write cycle when latch signal L2 was pulsed to ground at time t5. The initial operation of the sense circuit with input timing signals of FIG. 10 is similar to that previously described with the input timing signals of FIG. 3.

Figure 15:
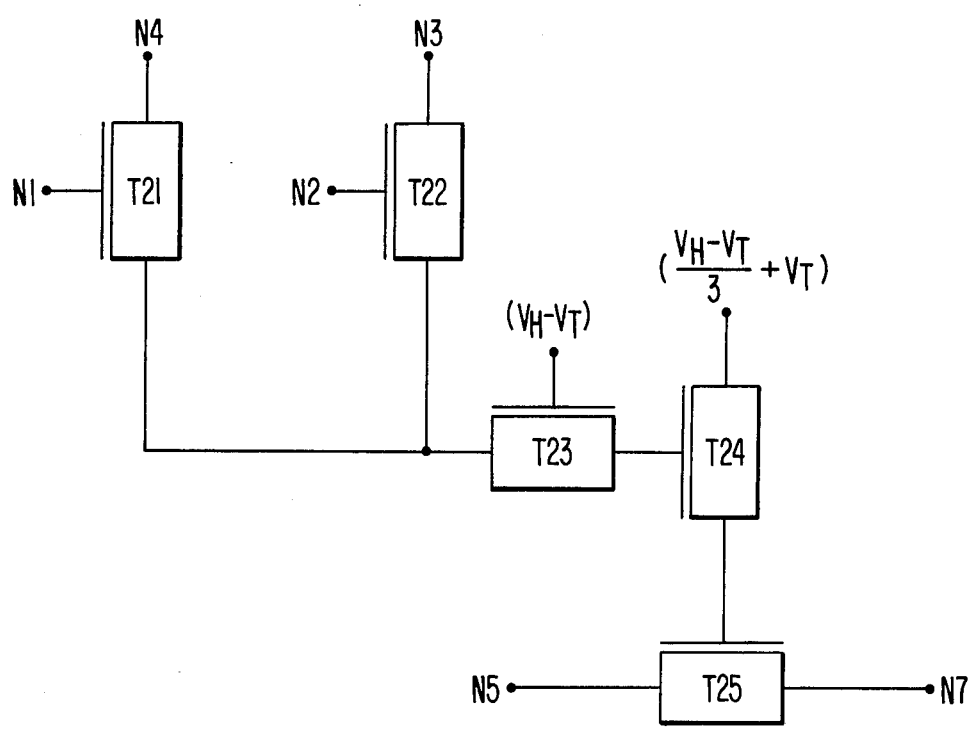
FIG. 15 is a schematic representation of an alternative re-write circuit for use in the sense circuit of FIG. 1 for a multilevel storage system according to the invention.

The re-write circuit of FIG. 15 includes five transistors, T21–T25, connected to the sense circuit between nodes N5 and N7. Operation of the re-write circuit of FIG. 15 will now be disclosed referring to FIG. 10 for the case when re-writing the data bits (10) as charge level 0 back into memory cell 11. Nodes N2 and N4 are initially at a high voltage level while nodes N1 and N3 remain at a low voltage level. Therefore, transistor T22 is on and transistor T21 is off. Transistor T23 is always on since its gate electrode is always at voltage level ($V_H$-$V_T$). However, since node N3 is at a low voltage level, transistor T24 and hence also transistor T25 remain off. Because isolation signal I1 and word line signal W1 were high and node N1 was discharged, pulsing up isolation signal I1 at time t6 had discharged capacitor C1 during reading of the data bits (10). Thus, capacitor C1 will remain appropriately discharged to represent the data bits (10).

When re-writing the data bits (11) as charge level 2/6Q back into memory cell 11, nodes N2 and N3 are initially at a high voltage level while nodes N1 and N4 are at a low voltage level. Therefore the gate of transistor T24 stays high. Voltage level $$\left(\frac{V_H - V_T}{3} + VT\right)$$

then reaches the gate electrode of transistor T25, turning it on. Node N5 was discharged and node N7 left at voltage level ($V_H$-3/6V) after reading the data bits (11). Switching on transistor T25 to the saturated mode of operation will therefore raise the voltage level of node N5 to ⅓ ($V_H$-$V_T$) and the charge level of capacitor C1 to 2/6Q. Node N7 will fall but have no effect on capacitor C2 because word line signal W2 is grounded.

When re-writing the data bits (00) as charge level 4/6Q back into memory cell 11, nodes N1 and N4 are initially at a high voltage level while nodes N2 and N3 are at a low voltage level. Since transistors T21 and T23 are thus on, the high voltage level of node N4 serves to keep on transistor T24. Voltage level $$\left(\frac{V_H - V_T}{3} + VT\right)$$

then reaches the gate electrode of transistor T25, turning it on. Node N7 was discharged and node N5 left at voltage level ($V_H$-2/6V) after reading the data bits (00). Switching on transistor T25 will therefore lower the voltage level of node N5 to approximately ⅓ ($V_H$-$V_T$) and the charge level of capacitor C1 to 4/6Q. Node N7 will rise but have no effect on capacitor C2 because word line signal W2 is grounded.

When re-writing the data bits (01) as charge level Q back into memory cell 11, nodes N1 and N3 are initially at a high voltage level while nodes N2 and N4 are at a low voltage level. Transistors T22 and T23 are thus on, but transistor T24 and hence also transistor T25 remain off. Since node N9 was left at voltage level $V_H$ after reading the data bits (01), capacitor C1 will remain appropriately charged to a level Q.

The re-write circuits shown in FIG. 8 and FIG. 15 are considered to be equally adequate alternatives. While the re-write circuit of FIG. 15 has fewer devices and may thus save circuit space, the re-write circuit of FIG. 8 requires simpler input timing signals.

While the invention has been particularly described with reference to a particular embodiment thereof, it will be understood by those skilled in the art that various changes in detail may be made therein without departing from the spirit, scope, and teaching of the invention. For example, any number of memory cells may be read by the sense circuit. As long as individual word lines accompany each memory cell, it is possible to read any given memory cell selected. Furthermore, if memory cell 12 of the embodiments herein disclosed was to be read, the operation of the sense circuit would be reversed as to left-right symmetry as shown in FIGS. 1, 8, and 15. Also, the number of possible charge levels stored in a given memory cell need not be limited to four, but may be any amount greater than 2 provided that data sensing is accomplished by a series of differential voltage level sensing circuits.

Accordingly, the invention herein disclosed is to be limited only as specified in the following claims.

What is claimed is:

1. A sense circuit for determining the data state of a data input signal corresponding to one of n charges levels, comprising:
   means for providing a data input signal voltage level representing a data state corresponding to one of n charge levels, n being an integer greater than 2;
   means for generating a first reference voltage having a predetermined level of magnitude;
   a first differential voltage level sensing circuit responsive to said data input signal voltage level and to said first reference voltage level, said first differential voltlage level sensing circuit providing at least one first binary data output signal as a function of the relative magnitudes of said data input signal voltage level and said first reference voltage level;
   means responsive to said first binary data output and said data input signal voltage level for generating an adjusted data signal voltage having a magnitude corresponding to a function of said data input signal voltage level and said first binary data output signal;
   means responsive to said first binary data output signal for generating a second reference voltage having a level of magnitude different from that of said first reference voltage level; and
   a second differential voltage level sensing circuit responsive to an adjusted data input signal voltage level and to said second reference voltage level, said second differential voltage level sensing circuit providing at least one second binary data output signal as a function of the relative magnitudes of said adjusted data input signal voltage level and said second reference voltage level;
   means responsive to said first binary data output signal and said second binary data output signal for determining the data state of one of said n charge levels as a function of said first binary data output signal and said second binary data output signal.

2. The sense circuit of claim 1 wherein said means responsive to said first binary data output signal for generating a second reference voltage level comprises:
   at least one capacitor having one terminal connected to said first binary data outpout signal of said first differential voltage level sensing circuit; and
   at least one transistor connected between an internal sense node of said second differential voltage sensing circuit for said second reference voltage level and the other terminal of said capacitor, the gate electrode of said transistor connected to a clocked voltage signal.

3. The sense circuit of claim 2 wherein said first and second differential voltage level sensing circuits each comprise a cross-coupled sense amplifier circuit.

4. The sense circuit of claim 1 further comprising a re-write circuit connected between said first and said second differential voltage level sensing circuits.

5. The sense circuit of claim 4 wherein said first and second differential voltage level sensing circuits each comprise a cross-coupled sense amplifier circuit.

6. The sense circuit of claim 1 wherein said first and second differential voltage level sensing circuits each comprise a cross-coupled sense amplifier circuit.

7. The sense circuit of claim 1 wherein said means responsive to said first binary data output and said data input signal voltage level for generating an adjusted data signal voltage level comprises:
   at least one capacitor having one terminal connected to said first binary data output signal of said first differential voltage level sensing circuit; and
   at least one transistor connected between an internal sense node of said second differential voltage sensing circuit for said adjusted data signal voltage level and the other terminal of said capacitor, the gate electrode of said transistor connected to a clocked voltage signal.

8. The sense circuit of claim 7 wherein said first and second differential voltage level sensing circuits each comprise a cross-coupled sense amplifier circuit.

9. The sense circuit of claim 1 wherein said means responsive to said first binary data output signal and said second binary data output signal for determining the data state of said n charge level comprises:
   at least one transistor with a first end connected to the first binary output signal of said first differential voltage level sensing circuit and a second end providing the first binary data output signal when the gate electrode of said transistor is pulsed with a clocked voltage signal; and
   at least one transistor with a first end connected to the second binary data output signal of said second differential voltage level sensing circuit and a second end providing the second binary data output signal when the gate electrode of said transistor is pulsed with a clocked voltage signal.

10. The sense circuit of claim 9 wherein said first and second differential voltage level sensing circuits each comprise a cross-coupled sense amplifier circuit.

* * * * *